United States Patent
Washington, II et al.

(10) Patent No.: US 9,685,600 B2
(45) Date of Patent: Jun. 20, 2017

(54) ENHANCED SUPERCONDUCTIVITY OF FULLERENES

(71) Applicant: SAVANNAH RIVER NUCLEAR SOLUTIONS, LLC, Aiken, SC (US)

(72) Inventors: Aaron L. Washington, II, Aiken, SC (US); Joseph A. Teprovich, Aiken, SC (US); Ragaiy Zidan, Aiken, SC (US)

(73) Assignee: Savannah River Nuclear Solutions, LLC, Aiken, SC (US)

(*) Notice: Subject to any disclaimer, the term of this patent is extended or adjusted under 35 U.S.C. 154(b) by 0 days.

(21) Appl. No.: 14/625,219

(22) Filed: Feb. 18, 2015

(65) Prior Publication Data

US 2016/0240765 A1 Aug. 18, 2016

(51) Int. Cl.
  *C01B 31/02* (2006.01)
  *H01L 39/12* (2006.01)
  *H01L 39/24* (2006.01)

(52) U.S. Cl.
  CPC ........ *H01L 39/123* (2013.01); *C01B 31/0213* (2013.01); *H01L 39/24* (2013.01)

(58) Field of Classification Search
  CPC ....... H01L 39/123; H01L 31/24; C07C 15/20; C07C 15/62; C07C 2104/00; C01B 31/0213
  See application file for complete search history.

(56) References Cited

U.S. PATENT DOCUMENTS

| | | | |
|---|---|---|---|
| 5,196,396 A | 3/1993 | Lieber | |
| 5,229,361 A | 7/1993 | Shiraishi et al. | |
| 5,294,600 A | 3/1994 | Tanigaki et al. | |
| 5,348,936 A | 9/1994 | McCauley, Jr. et al. | |
| 5,356,872 A | 10/1994 | Eidelloth et al. | |
| 5,380,595 A | 1/1995 | Ueba et al. | |
| 5,380,703 A | 1/1995 | Kao et al. | |
| 5,391,323 A | 2/1995 | Haddon et al. | |

(Continued)

FOREIGN PATENT DOCUMENTS

| WO | WO 92/20622 | 11/1992 |
|---|---|---|
| WO | WO 95/03938 A1 | 2/1995 |
| WO | WO 00/66813 | 11/2000 |

OTHER PUBLICATIONS

Hall, L. E., et al. "The structure of hydrogenated fullerene (C60H36)." The Journal of Physical Chemistry 97.21 (1993): 5741-5744.*

(Continued)

*Primary Examiner* — Richard M Rump
(74) *Attorney, Agent, or Firm* — Dority & Manning, P.A.

(57) ABSTRACT

Methods for enhancing characteristics of superconductive fullerenes and devices incorporating the fullerenes are disclosed. Enhancements can include increase in the critical transition temperature at a constant magnetic field; the existence of a superconducting hysteresis over a changing magnetic field; a decrease in the stabilizing magnetic field required for the onset of superconductivity; and/or an increase in the stability of superconductivity over a large magnetic field. The enhancements can be brought about by transmitting electromagnetic radiation to the superconductive fullerene such that the electromagnetic radiation impinges on the fullerene with an energy that is greater than the band gap of the fullerene.

21 Claims, 3 Drawing Sheets

(56) References Cited

U.S. PATENT DOCUMENTS

| | | | |
|---|---|---|---|
| 5,454,880 A | 10/1995 | Sariciftci et al. | |
| 5,993,697 A | 11/1999 | Cohen et al. | |
| 6,162,411 A | 12/2000 | Howard et al. | |
| 6,217,843 B1 | 4/2001 | Homyonfer | |
| 6,373,064 B1 | 4/2002 | Yao et al. | |
| 7,189,681 B2 | 3/2007 | Miyamoto | |
| 2002/0017612 A1 | 2/2002 | Yu et al. | |
| 2002/0086800 A1 | 7/2002 | Miyamoto | |
| 2010/0249168 A1 | 9/2010 | Kronholm et al. | |
| 2010/0278885 A1 | 11/2010 | Ikeda et al. | |
| 2011/0269629 A1 | 11/2011 | Giustino et al. | |
| 2012/0205587 A1 | 8/2012 | Choi et al. | |
| 2013/0102812 A1 | 4/2013 | Chung et al. | |

OTHER PUBLICATIONS

On, Do Trong, et al. "Enhancement of superconductive shielding via photoinduced surface modification." The Journal of Physical Chemistry B 103.18 (1999): 3511-3514.*

Limonov, M. F., et al. "Phonons and electron-phonon interaction in halogen-fullerene compounds." Physical Review B 57.13 (1998): 7586.*

Celli, Annamaria, et al. "Synthesis of novel fullerene-functionalized polysulfones for optical limiting applications." Reactive and Functional Polymers 71.6 (2011): 641-647.*

Wang, Yayu, et al. "Tuning fulleride electronic structure and molecular ordering via variable layer index." Nature materials 7.3 (2008): 194-197.*

Rogner, Ingo, Paul Birkett, and Eleanor EB Campbell. "Hydrogenated and chlorinated fullerenes detected by "cooled" modified matrix-assisted laser desorption and ionisation mass spectroscopy (MALDI-MS)." International journal of mass spectrometry and ion processes 156.1 (1996): 103-108.*

Ganin, Alexey Y., et al. "Bulk superconductivity at 38 K in a molecular system." Nature materials 7.5 (2008): 367-371.*

Berseth et al.; *Carbon Nanomaterials as Catalysts for Hydrogen Uptake and Release in $NaAlH_4$*; Nano Lett., (2009), 9 (4), pp. 1501-1505.

Brown, et al.; *Pressure dependence of superconductivity in the $Na_2Rb_{0.5}Cs_{0.5}C_{60}$ fulleride*; Physical Review B, vol. 59, No. 6, Feb. 1, 1999, pp. 4439-4444.

Ganin, et al.; *Polymorphism control of superconductivity and magnetism in $C_sC_{60}$ close to the Mott transition*; Nature Lett., vol. 466, Jul. 2010, pp. 221-227.

Kumar, et al.; *Possiblity of Photoinduced Superconductivity*; Physical Review; Oct. 10, 1968; vol. 174, No. 2; pp. 482-488.

Lederman, et al.; *Photoinduced superconductivity and structural changes in high temperature superconducting films*; Appl. Phys. Lett. 64 (5), Jan. 31, 1994, pp. 652-654.

Margadonna, et al.; $Li_4C_{60}$: *A Polymeric Fulleride with a Two-Dimensional Architecture and Mixed Interfullerene Bonding Motifs*; J. Am. Chem. Soc., (2004); 126 (46), pp. 15032-15033.

Peña, et al.; *Interfacially Controlled Transient Photoinduced Superconductivity*; The American Physical Society; Physical Review Letters, PRL 97, 177005 (2006); (week ending Oct. 27, 2006); pp. 177005-1-177005-4.

Sekine, et al.; *Magnetic behavior and structure of the halogendoped fullerene C60*; Jnl. of Applied Physics; (1992) 72, pp. 5448 5450.

Teprovich, Jr., et al.; *Synthesis and Characterization of a Lithium-Doped Fullerane ($Li_x$-$C_{60}$-$H_y$) for Reversible Hydrogen Storage*; NANO Letters; 2012, 12, pp. 582-589.

Tsai et al.; *Photoinduced Superconductivity in $YSr_xBa_{2-x}Cu_3O_y$ Films*; Chinese Journal of Physics; Apr. 1996; vol. 34, No. 2-II; pp. 616-620.

Wellons, et al.; *Novel catalytic effects of fullerene for $LiBH_4$ hydrogen uptake and release*. Nanotechnology. May 20, 2009;20(20):204022. doi:10.1088/0957-4484/20/20/204022. Epub Apr. 24, 2009.

Savannah River Nuclear Solutions, LLC; International Patent Application No. PCT/US2016/018384; International Search Report; dated Jun. 17, 2016; (3 pages).

Tokunaga; "Chapter 13: Hydrogenation of Fullerene C60: Material Design of Organic Semiconductors by Computation," *Intech*, 2012; pp. 309-326.

* cited by examiner

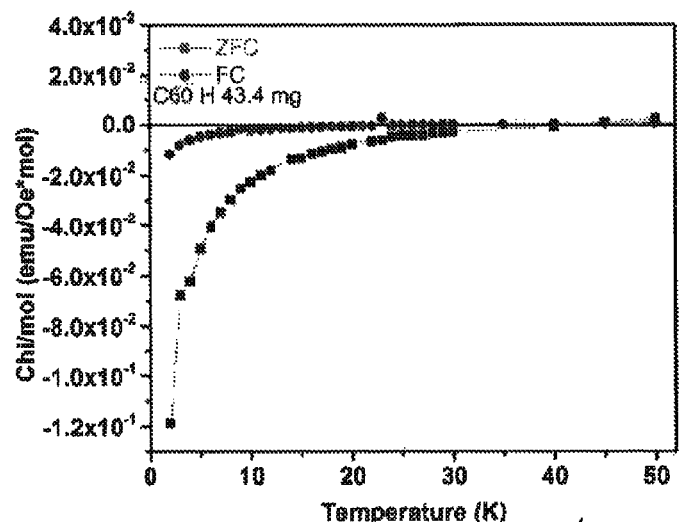
FIG. 5A
FIG. 5B
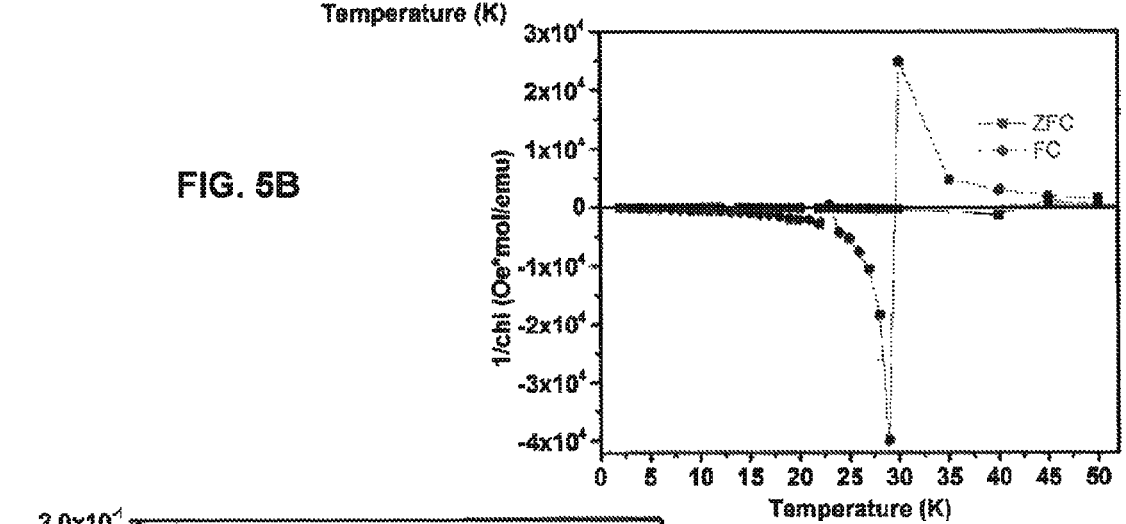
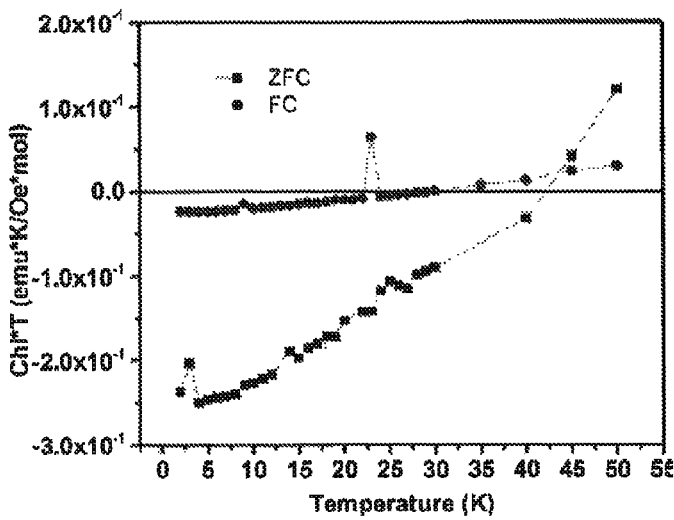
FIG. 5C

US 9,685,600 B2

ENHANCED SUPERCONDUCTIVITY OF FULLERENES

STATEMENT AS TO RIGHTS TO INVENTIONS MADE UNDER FEDERALLY SPONSORED RESEARCH

This invention was made with Government support under Contract No. DE-AC09-08SR22470 awarded by the United States Department of Energy. The Government has certain rights in the invention.

BACKGROUND

Superconductivity was discovered by Dutch physicist Heike Kamerlingh Onnes on Apr. 8, 1911 in Leiden, Netherlands. It is a phenomenon of exactly zero electrical resistance and expulsion of magnetic fields that occurs in certain materials when cooled below a critical transition temperature that is a unique characteristic of each superconductive material. Until 1986, physicists believed that superconductivity was forbidden at temperatures above about 30 K, and utilization of known superconductive materials was extremely expensive and highly impractical. However, in that year, superconductivity was discovered in a lanthanum-based cuprate perovskite having a critical transition temperature of 35 K. This discovery quickly led to the finding that by replacing the lanthanum with yttrium (i.e., YBCO) the critical transition temperature could be raised to 92 K. Other such materials having critical transition temperatures of greater than about 30 K have since been discovered or developed and are generally termed high temperature superconductors.

The development of high temperature superconductors having a critical transition temperature of greater than 77 K has been significant as it has allowed liquid nitrogen to be utilized as a refrigerant. As liquid nitrogen can be produced relatively cheaply, even on-site, previous problems with the use of liquid helium have been overcome and the practical application of superconductive materials has been greatly expanded.

Unfortunately, the ceramic high temperature superconductors are complex, expensive to produce and often toxic. As such, the development of alternative superconductive materials that are less expensive and non-toxic has been of great interest.

One of the most promising materials for development as useful superconducting materials are carbon based materials such as fullerenes. Fullerenes, which include any carbon-based molecule in the form of a hollow structure, were first produced experimentally in September 1985. Among the spherical fullerenes, $C_{60}$ and $C_{70}$ are the most common. Fullerenes intercalated with alkaline metals including potassium, cesium, and rubidium have been shown to possess superconductivity, as have halogen-doped fullerenes. Unfortunately, while these carbon-based superconductive materials show great promise, they have low critical transition temperatures. For example, rubidium-doped $C_{60}$ has a critical transition temperature $T_c$ of 28 K, and ternary intercalated fullerenes doped with cesium and rubidium have $T_c$ of 33 K. Moreover, these materials still incorporate metals or halogens, and in certain applications may present materials issues.

What are needed in the art are additional non-toxic superconductive fullerenes as well as methods for enhancing characteristics of superconducting fullerenes. For instance, metal-free superconductive fullerenes would be of benefit. In addition, a method for increasing the critical transition temperature and/or decreasing the required stabilizing magnetic field required for the onset of superconductivity would be of great benefit. Moreover, devices that incorporate superconducting fullerenes with such enhanced features would be of great benefit.

SUMMARY

Aspects and advantages of the invention will be set forth in part in the following description, or may be obvious from the description, or may be learned through practice of the invention.

In one embodiment disclosed herein is a method for enhancing one or more characteristics of a superconductive fullerene. Enhancements can include increase in the critical transition temperature at a constant magnetic field; the existence of a superconducting hysteresis over a changing magnetic field; a decrease in the stabilizing magnetic field required for the onset of superconductivity; and/or an increase in the stability of superconductivity over a large magnetic field. The enhancements can be brought about by transmitting electromagnetic radiation to the superconductive fullerene such that the electromagnetic radiation impinges on the fullerene with an energy that is greater than the band gap of the fullerene.

According to another embodiment, disclosed are superconductive hydrogenated fullerenes and methods for forming the superconductive fullerenes. For instance, a superconductive fullerene is disclosed that includes a plurality of hydrogens bonded to carbons of the fullerene cage, wherein the plurality of hydrogens is sufficient such that the hydrogenated fullerene is superconductive and has a critical transition temperature of about 10 K or greater.

Also disclosed are devices that incorporate the superconductive fullerenes. For example, a device can include superconductive fullerenes and a source for electromagnetic radiation, e.g., a light emitting diode, arranged such that the two are in photonic communication with one another.

These and other features, aspects and advantages of the present disclosure will become better understood with reference to the following description and appended claims.

BRIEF DESCRIPTION OF THE FIGURES

A full and enabling disclosure of the present invention, including the best mode thereof, directed to one of ordinary skill in the art, is set forth in the specification, which makes reference to the appended figures, in which:

FIG. 5 graphically illustrates the superconductive characteristics of a hydrogenated fullerene including the magnetic susceptibility ($\chi$) per mole (FIG. 5A), $1/\chi$ (FIG. 5B) and $\chi^*T$ (FIG. 5C).

DETAILED DESCRIPTION

Figure 1:
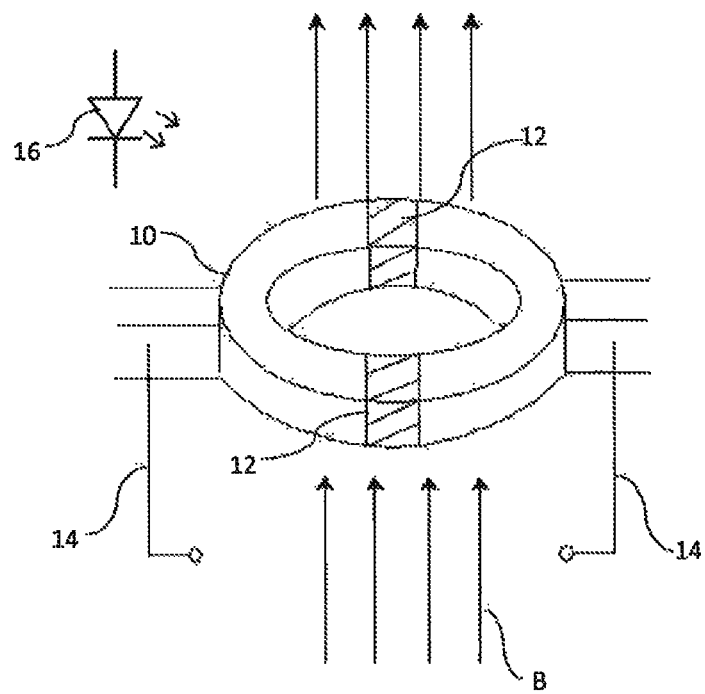
FIG. 1 schematically illustrates a superconducting quantum interference device (SQUID) as may incorporate the enhancements as described herein.

It is to be understood by one of ordinary skill in the art that the present discussion is a description of exemplary embodiments only, and is not intended as limiting the broader aspects of the present disclosure. Each example is provided by way of explanation of the subject matter, not limitation thereof. In fact, it will be apparent to those skilled in the art that various modifications and variations can be made in the present disclosure without departing from the scope or spirit of the subject matter. For instance, features illustrated or described as part of one embodiment can be used with another embodiment to yield a still further embodiment. Thus, it is intended that the present disclosure covers such modifications and variations as come within the scope of the appended claims and their equivalents.

The present disclosure is generally directed to superconductive fullerenes, methods for enhancing superconductivity characteristics of fullerenes and devices that can incorporate superconductive fullerenes. The disclosed enhancement methods include impinging superconductive fullerenes with electromagnetic radiation at a predetermined energy so as to enhance superconductive characteristics of the fullerenes. Also disclosed are hydrogenated fullerenes that can exhibit superconductivity, e.g., $C_{60}H_{18}$.

Without wishing to be bound to any particular theory, it is believed that the addition of energy in the form of electromagnetic radiation to superconductive fullerenes can significantly increase the number of available charge carriers and/or phonons in the conduction band of the materials. This can enhance multiple characteristics of the superconductive materials including, without limitation, increase in the critical transition temperature of the materials, the creation of a superconducting hysteresis over a changing magnetic field, a decrease in the strength of a required stabilizing magnetic field for onset of superconductivity, and/or an increase in the stability of superconductivity over a large magnetic field.

In general, any superconducting fullerenes may be enhanced according to the disclosed methods. By way of example, the superconducting fullerenes can be alkali metal intercalated fullerenes, halogen doped fullerenes, or hydrogenated fullerenes. For instance, superconductive hydrogenated fullerenes can be subjected to electromagnetic radiation according to described methods and one or more superconductive characteristics of the hydrogenated fullerenes can be enhanced.

While there is no particular requirement with regard to the formation method used to form the superconductive fullerenes, the degree of enhancement attained by the method can vary depending upon the phase purity of the material. For instance, the fullerenes can have a low ratio of isomers, which can provide for improved superconductive characteristics in some embodiments. As such, it may be beneficial to utilize high purity formation techniques.

In addition, the presently disclosed methods are not limited to any particular size or shape for the superconducting fullerenes. For instance, in one embodiment $C_{60}$ or $C_{70}$ spherical fullerenes may be utilized in forming the superconductive material, but the methods and devices are not limited to these fullerenes, and large or smaller, as well as non-spherical fullerenes are contemplated herein.

As the degree of improvement in superconductive characteristics of the material can vary depending upon the degree of lattice expansion attained upon the excitation of the fullerenes, in some embodiments fullerenes can be utilized that have been subjected to higher levels of lattice expansion in formation of the materials. For instance, fullerenes intercalated with a ternary metal or alloy and/or fullerenes that are intercalated with a relatively large atom(s) can be utilized. Similarly, higher levels of hydrogenation can lead to larger lattice expansion and as such, it may be preferred in some embodiments to utilized hydrogenated fullerenes with a high level of hydrogenation as the superconductive material to be subjected to the disclosed processes.

Alkali metal intercalated fullerenes can be utilized in one embodiment. For example, fullerenes intercalated with a single alkali metal can be utilized. Alternatively, the fullerenes can be intercalated with a metal alloy in which at least one of the metals is an alkali metal. In general, the intercalated metals will be single, binary, or ternary intercalates, but this is not a requirement of the disclosure. For instance the intercalated fullerenes can have the general structure:

$$Cs_aRb_bK_cM_yC_n$$

in which
M=a secondary metal, e.g., Hg, Bi, or Tl
a, b, c=0-3, wherein at least one of a, b, c is at least 1
y=0-2, and
n is 20 or greater, e.g., 60, 70, 76, 84, 90, or 94

Intercalated fullerenes can be formed by reaction of preformed fullerenes with the desired metals in a two-step process or alternatively in a single-step process in which fullerene formation and intercalation occurs in a single step. In a two-step formation process, the empty fullerenes may be purchased on the retail market (e.g., the Texas Fullerene Corporation, Arizona Fullerene Consortium, S.E.S. Research, etc.). Alternatively, fullerenes may be formed according to any suitable formation process. By way of example, $C_{60}$ can be synthesized in a stainless steel chamber using high-purity graphite electrodes (99.9995%) generally as known in the art (see, e.g., W. Kratschmer et al. (1990), Nature, Vol. 347, pp. 354-58 and R. E. Haufler et al. (1990), Jour. Phys. Chem., Vol. 94, pp. 8634-36). The carbon soot produced from an arc discharge in 100-150 torr of helium can be extracted with benzene, and pure $C_{60}$ can be obtained from this solution by chromatography, for instance on neutral alumina as generally described (see, e.g., F. Diederich et al. (1991), Science, Vol. 252, pp. 548-51). The purification and isolation of $C_{60}$ can be carried out in the dark to minimize impurities resulting from photodegradation and the $C_{60}$ can be dried under vacuum for several hours (200° C.-250° C.) to remove solvent.

According to another embodiment, fullerene formation methods as described in U.S. Pat. No. 5,273,729 to Howard, et al., which is incorporated herein by reference, can be utilized. Briefly, according to this method, fullerenes can be prepared by burning a carbon-containing compound in a flame and collecting the condensibles. The flame conditions can be set by controlling C/O ratio, chamber pressure, residence time in the flame, diluent concentration and gas velocity. For example, the fuel can be any hydrocarbon, fossil fuel, biomass fuel or products derived therefrom and the C/O ratio can be in the range of 0.72 to 1.07. Argon can be utilized as the diluent in a concentration range of 0 to 40 mol %. The chamber pressure can be sub-atmospheric or atmospheric and the gas velocity can be in the range of 14 to 75 cm/s, although on an industrial scale, gas velocities could be much higher. Additives such as halogens can be used to enhance fuel to fullerene conversion by reducing the amount of available hydrogen in the flame. Additional energy can be supplied to the flame from an external energy source such as electrical resistance heating, microwave heating, electrical discharge heating and countercurrent heating of the input streams to raise the flame temperature, e.g., in the range of 1400K to 3000K.

Condensibles can be collected alone or with soot, where present. The condensibles or soot can be collected from the tail end of the flame, from within the flame or from the inside surface of the burner chamber deposited during combustion. Combustibles can be collected from within the flame by drawing out the combustibles with a probe or pipe and directing the stream through a trap. In larger scale operations, the pipe can be cooled with a water jacket and be provided with means for controlled rates of cooling.

This process can be utilized to form empty fullerenes that are later intercalated with an alkali metal according to a two-step process or, alternatively, can be utilized to form the intercalated fullerenes in a single step process. According to the single step formation process, the desired alkali metals can be included in the flame and the intercalated superconducting fullerenes can be formed in a single step.

The yield of fullerenes according to this method can generally be in the range of 0.003 to 7% of the total soot mass.

The fullerenes can be purified using conventional purification techniques for instance by extraction from the soot by solvent extraction. The extract can be further purified and the different fullerene fractions separated using liquid chromatography, gas chromatography, supercritical fluid chromatography, sublimation or distillation techniques as known in the art.

Intercalation of the fullerenes can be carried out in a separate step, following formation of the fullerenes. Methods of forming intercalated fullerenes as known in the art can be utilized. For instance, methods as described in U.S. Pat. No. 5,196,396 to Lieber, U.S. Pat. No. 5,294,600 to Tanagaki, et al., or U.S. Pat. No. 5,348,936 to McCauley, Jr., et al., all of which are incorporated herein by reference, can be utilized.

In one embodiment, a wet chemical synthesis method may be utilized. A wet chemical synthesis method may be preferred in one embodiment as this can produce a high purity product. For instance, solvent assisted method as is known in the art can be utilized (Teprovich, Jr., et al., *Nano Lett.* 2012, 12, 582-589). Briefly, this method can include combining the fullerenes with the desired intercalant source (e.g., LiH), for instance in a Schlenk flask or other suitable container, in an inert atmosphere and optionally at a vacuum pressure. Solvent (e.g., tetrahydrofuran) can be added and the mixture stirred for several hours to obtain the intercalated fullerenes.

According to another method, solid-phase (powdery or finely particulate) fullerene and an alkali metal or metals can be mixed with each other ultrasonically followed by heat treatment. For instance, solid-phase fullerenes and an alkali metal or metals can be combined in a stoichiometric amount and can be placed into an appropriate solution contained in a vessel. Following combination, the components can be subjected to ultrasonic energy for mixing. The time of ultrasonic treatment can generally be from about 10 to about 60 minutes. The frequency and power of ultrasonic wave to be applied are not limited specifically, and can be for example, about 50 kHz and about 150 W, respectively. The mixing can be enhanced by increasing the temperature of the solution in the vessel, for instance to a temperature of from about 40° C. to about 50° C. If desired, the solid-phase fullerene can be pulverized, e.g., by use of a mortar or the like prior to mixing, and the uniformity of the mixture can be improved.

Following sonication the mixture can be heat treated, for instance at a temperature of from about 350° C. to about 400° C. for a period of about 50 hours or more, for instance from about 100 hours to about 700 hours, during which the metal can thermally diffused into the fullerene. Following the heat treatment, the temperature can be gradually lowered. For instance, the cooling rate can be about 1° C./min or less in one embodiment.

According to one embodiment, the superconductive fullerenes for processing according to the disclosed enhancement procedure can be halogen doped superconductive fullerenes. For example, halogen doped fullerenes as described in U.S. Pat. No. 5,380,703 to Kao, et al., which is incorporated herein by reference, can be processed for enhancement according to the disclosed methods. Halogen doped fullerenes can exhibit superconductive critical temperatures prior to the disclosed enhancement methods of up to about 60 K or about 70 K. Moreover, at temperatures below the superconductive critical transition temperature, halogen doped fullerenes can exhibit diamagnetic behavior.

The halogen dopant can be, for example, ICl, IBr, and/or other stable halogen molecules that include two halogen elements bonded together. A halogen doped fullerene can be formed in one embodiment by vaporizing the halogen dopant and contacting the fullerenes with the vaporized dopant. However, the method of doping is not limited, and other methods, such as sputtering or laser ablation, can be used to achieve doping.

According to the vaporization method, the halogen dopant can be kept at room temperature or above so that the vapor pressure of the halogen compound is sufficient to result in halogen-doping of the fullerenes. In one particular embodiment, a fullerene can be doped with iodine chloride, ICl. Although ICl is a solid at room temperature, heating to about 30° C. can convert the ICl to a liquid. By maintaining the ICl and fullerenes in a closed atmosphere at room temperature for a prolonged period of time, e.g., about 1 to about 5 hours, the fullerenes can be doped with the halogen compound.

In one embodiment, ICl can be heated prior to contact with the fullerenes, for example to about 40° C. to about 60° C. The ICl vapor can then be contacted with the fullerenes for a sufficient time to achieve doping of the fullerenes with at least one of I and Cl. The fullerenes can also be heated during the contact period. In one embodiment, the fullerenes can be heated to a temperature greater than that to which the ICl is heated. For example, the fullerenes can be heated to about 60° C. while the ICl can be heated to about 40° C. For instance, the fullerenes may be heated to about 80° C., and the halogen dopant may be heated to about 50° C. or even higher. It is not required, however, that either the fullerenes or ICl be heated, since even at room temperature, the fullerenes can be doped following exposure to the halogen vapor.

Other methods as have been described may alternatively be utilized to form the halogenated fullerenes. For example, methods as described by Sekine, et al. may be utilized (J. Appl. Phys. 72 (11), 1 Dec. 1992). Briefly, the fullerenes can be combined with the halogen source (e.g., IBr) in a vacuum and heat treated in a two phase process, the first phase at a temperature of 250° C. for 5 minutes, followed by a natural cool and a second treatment at a temperature of 200° C. for 20 hours.

In one embodiment, the superconductive fullerenes that can be enhanced according to the disclosed methods can be hydrogenated, which have not previously been known to be capable of exhibiting superconductive behavior. The superconductive hydrogenated fullerenes can include suitable hydrogen bound to the fullerene cage to provide the desired superconductive characteristics, e.g., a critical transition temperature of about 10 K or greater. For instance, the superconductive hydrogenated fullerenes can have a general structure of:

in which n is 20 or greater, e.g., 60, 70, 76, 84, 90, or 94, and x=n−2

While the number of hydrogens can vary, it is believed that the higher the number of hydrogens, the higher the potential for electron doping and the greater the critical transition temperature of the hydrogenated fullerenes. For instance, the hydrogenated fullerenes can include about 10 hydrogens per fullerene or more, about 14 hydrogens per fullerene or more, or about 20 hydrogens per fullerene or more, for instance from about 10 to about 30 hydrogens in one embodiment, with larger fullerenes obviously being capable of carrying more hydrogens.

There are a number of known approaches suitable for producing hydrogenated fullerenes, and the present disclosure is not limited to any specific approach. However, suitable hydrogenation processes must be capable of hydrogenating the fullerenes to the point that they are capable of exhibiting superconductive behavior. Methods as are known in the art may be generally utilized including, without limitation, Birch reduction, hydroboration, hydrozirconation, solid phase hydrogenation, transfer hydrogenation, electrochemical reduction, dissolving metals reduction, chemical reduction with diimides, hydrogen radical induced hydrogenation, and photoinduced electron transfer.

In one embodiment, methods as described by Teprovich, Jr., et al. (*Nano Lett.* 2012, 12, 582-589) can be utilized. Briefly, according to this method, the fullerenes can be subjected to a series of desorption/absorption cycles on a Sievert apparatus at increased temperature (e.g., about 200° C. or greater or about 300° or greater, or up to about 500° C. in some embodiments) and high pressure hydrogen atmosphere (e.g., about 5 megapascals or greater, or about 10 megapascals or greater in some embodiments) for a period of time (e.g., about 5 hours or more, or about 10 hours or more in some embodiments).

Other methods as may be utilized have been described in the review article; N. F. Goldshleger and A. P. Moravskii, "Fullerene Hydrides: Synthesis, Properties, and Structure," Russian Chemical Reviews, 66 (4) 323-342 (1997). One of the approaches is described in reference to C. Jin, R. Hettich, R. Compton, D. Joyce, J. Blencoe, and T. Burch, "Direct Solid-Phase Hydrogenation of Fullerenes," J. Phys. Chem. 98, 4215 (1994). In this approach high purity hydrogenated $C_{60}$, $C_{70}$, or mixed $C_{60}/C_{70}$ can be produced.

The superconductive fullerenes can be derivatized superconductive fullerenes. By way of example, the superconductive fullerenes can be derivatized according to methods as described in U.S. Pat. No. 5,462,680 to Brois, et al., which is incorporated by reference. Briefly, according to this method, unactivated alkane hydrocarbons, including saturated hydrocarbon polymers and lower molecular weight saturated hydrocarbons, can form adducts with fullerenes when reacted in the presence of a free radical initiator such as dialkyl peroxides. The free radical initiators typically abstract at least one hydrogen from the alkane hydrocarbon to form free radicals that add to fullerenes in substantial numbers (e.g., from 1 up to about 14 per fullerene).

To attain the desired enhancements, the superconductive fullerenes can be placed in photonic communication with a source of electromagnetic energy. The electromagnetic energy that impinges upon the fullerenes can have a high enough energy level so as to produce the desired affects, i.e., generate additional charge carriers and/or phonons in the conduction band, which can enhance the superconductive characteristics of the materials. As such, the energy level of the impinging electromagnetism can be at a higher energy than the band gap of the fullerenes at the critical transition temperature of the fullerenes.

The electromagnetic energy source, e.g., a light source, can be directed at the superconducting fullerenes, which can be isolated or in the form of a composite. For instance, a composite including the fullerenes as a superconductive component of the composite can be subjected to the electromagnetic energy. A composite can include the superconductive fullerenes in any suitable fashion in conjunction with one or more additional materials. For instance, a layered composite including the fullerenes deposited on a substrate, e.g., a carbon-based substrate such as graphite can be placed in communication with the energy source. A layered superconductive composite can be formed in one embodiment according to methods described in International Patent Application No. WO 00/66813 to Efimov, et al. Deposition methods can include, without limitation, electrochemical deposition, sputtering, and the like.

Other composites including the superconductive fullerenes can be utilized such as, for instance, a polymeric matrix that encapsulates the superconductive fullerenes. A composite that includes the superconductive fullerenes combined with other materials such as matrix materials, non-conductive particulate materials, fibrous materials, and the like can generally include the superconductive fullerenes in an amount necessary to obtain conductivity in the material, i.e., at least the percolation threshold.

As previously stated, the energy of the light source can be greater than the fullerene band gap at the critical transition temperature. By way of example, the impinging electromagnetic energy can have an energy of about 1 electron Volt (eV) or greater, for instance from about 1 eV to about 5 eV, or from about 1.3 eV to about 2 eV, or from about 1.5 eV to about 1.8 eV, in some embodiments.

The necessary energy level can be attained through combination of the photonic energy and the intensity of the electromagnetic energy at the superconductive fullerenes. Electromagnetic energy that impinges on the superconducting material can have a photonic energy $E=hc/\lambda$ in which h=Planck's constant ($6.626 \times 10^{-34}$ J-sec), c=the speed of light ($2.998 \times 10^8$ m/sec) and $\lambda$=the wavelength of the impinging light (or roughly $1.24/\lambda$ (μm)). Thus, in one embodiment, the impinging electromagnetic energy can have a wavelength such that the photonic energy E is greater than the band gap of the superconducting fullerenes at the critical transition temperature.

In addition, the intensity of the impinging light at the fullerenes can generally be about 1 milliwatt (mW) or greater, for instance from about 1 mW to about 100 mW in one embodiment, or from about 5 mW to about 50 mW in some embodiments.

Accordingly, the electromagnetic energy source can be in one embodiment an external light source that may produce ultraviolet, visible, or infrared light, depending upon the band gap of the superconducting fullerenes.

Different light beam intensities and photon energies can produce different degrees of enhancement in the superconductive materials. For instance, the critical transition temperature of the superconductive fullerenes can be fine-tuned by changing the electromagnetic beam intensity and/or wavelength, and the performance of the superconductive material can thus be optimized.

Enhancements in superconductivity of the fullerenes can affect both temperature and magnetic characteristics of the materials. For instance, the critical transition temperature of the superconductive fullerenes can be increased by about 10 K or more, for instance about 15 K or higher or from about 10 K to about 25 K higher. In one embodiment, the increased critical transition temperature can be 77 K or greater.

With regard to magnetic affects, upon impingement of the superconductive fullerenes with the electromagnetic energy, the materials can develop a superconducting hysteresis in a changing magnetic field. This can be useful in applications in which it is useful to maintain a memory of the material's previous conditions. A nonlinear response to a changing magnetic field can also be useful in boosting the response of a coil wrapped around an electromagnet. By use of the disclosed methods, the stabilizing magnetic field necessary in certain applications of superconductive materials can be decreased. For instance a stabilizing magnetic field strength can be about 1000 oersted (Oe) or less at the temperature of use (e.g., about 30 K), for instance about 500 Oe or less or from about 10 to about 100 Oe in some embodiments. In addition, the superconductivity of the materials can be stable over a larger magnetic field as compared to previously known materials.

The enhanced superconductive materials can be used in any superconductive device as is generally known. For instance, in one embodiment, the disclosed method and enhanced materials can be incorporated in a superconducting quantum interference device (SQUID). A schematic diagram of a SQUID is presented in FIG. 1. A SQUID can be utilized as a sensitive detector of minute magnetic fields. It includes of a loop 10 of the superconducting material and two Josephson Junctions 12. A Josephson Junction is a relatively weak link between two superconductors. For instance a short section of insulative or non-superconducting metal or a physical constriction that weakens the superconductivity of the device at the point of contact. The device also includes electrical connections 14 to create a biasing current and an electromagnetic energy source, which, in this embodiment, is illustrated as an LED 16 in photonic communication with the loop 10. The SQUID can detect a magnetic field B, with high sensitivity. The extreme sensitivity of SQUIDs as magnetometers makes them ideal for studies in medicine, such as magnetoencephalography, the measurement of neural activity inside human and animal brains, as well as being available commercially for the measurement of magnetic properties of materials.

Figure 2:
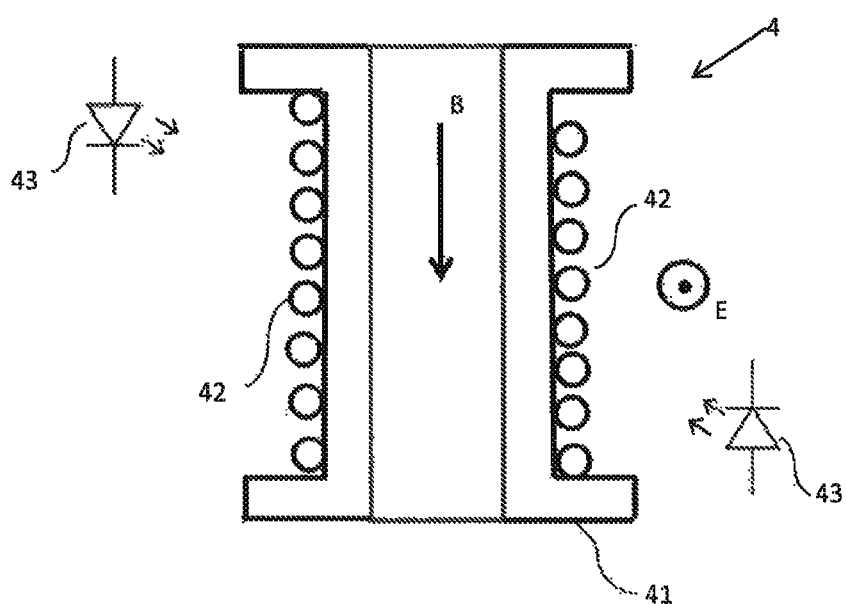
FIG. 2 schematically illustrates an embodiment of a superconducting coil as may incorporate the enhancements as described herein.

FIG. 2 presents a schematic illustration of a magnetic superconducting coil 4 as may include enhancements as described herein. The magnetic coil 4 can be utilized to generate a magnetic field B perpendicular to an electrical field, as is known. The superconducting coil 4 comprises a metal can 41 and a wire 42 formed of a superconducting material (e.g., a substrate coated with the superconducting fullerenes) wound about the metal can 41 and having one or more light sources 43 in photonic communication with the superconducting material of the wire 42. The coil 4 can include a plurality of windings, for instance more than 100 windings in some embodiments.

Figure 3:
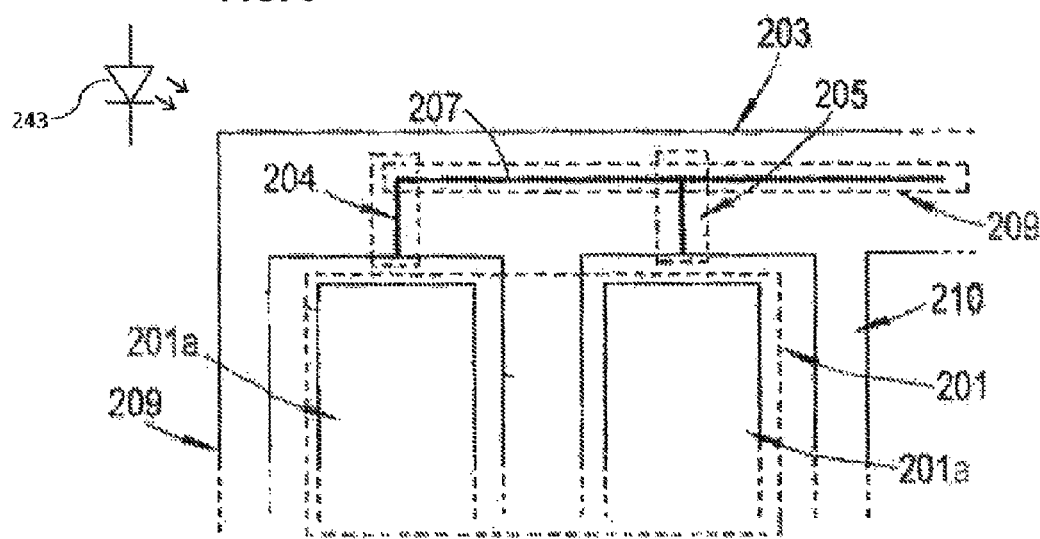
FIG. 3 is a schematic end view of a coupling device of an in-line gearbox as may incorporate the enhancements as described herein.
Figure 4:
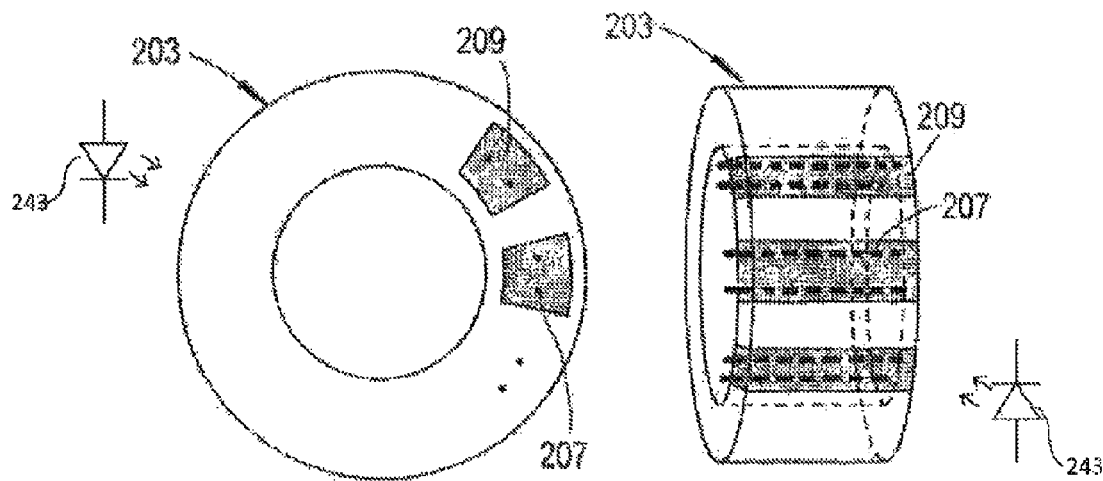
FIG. 4 is a schematic transverse cross-section through the coupling device of the gearbox of FIG. 3.

FIG. 3 and FIG. 4 present schematic views of the end of a coupling device 203 (FIG. 3), in a transverse cross-section (FIG. 4A), and in a side view (FIG. 4B) with internal features. Electrical heating elements (e.g. wires) 207 extend longitudinally through superconductive material of the coupling device. The device can also include light sources 243 to enhance the superconductivity of the material. Electrical current passing through the heating elements 207 raises the temperature of the surrounding region (shaded grey in FIG. 7B) of superconducting material to above the critical temperature and thus renders the region permeable to the magnetic fields generated by the first 201a and second rotors of the first 201 and second gear systems. The extent of the heated regions depends on factors such as the thermal conductivity of the superconducting material, the heat flow from the conductors, and the effectiveness of the coolant. Thermally insulating elements (not shown) may be included in the coupling device to reduce the flow of heat from the heated regions to the non-heated regions of the device. For example, the superconducting material of the device may have recesses, slots or gaps which receive sheets of thermally insulating material and which define the boundaries of the heated regions. The heated regions form interpoles 209. An appropriate angular spacing of interpoles can be formed by suitable selection of the heating elements 207 though which current is passed. Generally, the heated regions do not extend to the inner and outer surfaces of the coupling device, as this helps the magnetic field to stay within the interpoles 209.

The current flowing through the heating elements 207 produces a magnetic field which can interact with the fields generated by the rotors to produce an unwanted reaction force in the coupling device. To eliminate or reduce this effect, the heating elements can be arranged, e.g. as twisted wire pairs with the current in each wire of the pair flowing in a different direction. With such an arrangement the magnetic field produced by one wire is cancelled out by the magnetic field produced by the other wire of the pair. The heating elements are typically electrically insulated from the surrounding superconducting material, but not thermally insulated.

Further heating elements 204 (e.g. electrically insulated twisted pair wires) are also located in the coupling device between each rotor and the heating elements 207 to form activatable and deactivatable flux paths 205. Each heating element 204 may take the form of one or more twisted pair wires following a circular path around the circumference of a respective rotor 201a. When a current is passed through a heating element 204, a surrounding heated region is produced in which the temperature is higher than the critical temperature rendering the region permeable to the magnetic fields. The surrounding region is thus an activated flux path which allows flux to extend from the respective rotor to the interpoles 209. When the current is stopped, the temperature drops to below the critical temperature, and the flux path becomes inactive.

Of course, these exemplary embodiments are only representative examples of devices that can incorporate the enhanced superconductive fullerenes. Other applications for the materials can include, without limitation, formation of fast digital circuits, low-loss power cables, RF and microwave filters, current limiters, railgun and coilgun magnets, and so forth.

The present disclosure may be better understood with reference to the following Example.

Example

Hydrogenated fullerenes were examined for superconductivity. To form the materials, a sample of pure $C_{60}$ was combined with tetrahydrofuran and then subjected to a series of hydrogen desorption/absorption cycles on a Sieverts apparatus at 210° C. or at 350° C. under 105 bar $H_2$ for 11 hours. The samples were cooled down without a magnetic field (in which case the magnetic field (100 Oe) was turned on and the graph points were determined as the sample was heated), marked as ZFC on FIG. 5. Alternatively, the samples were cooled down within a magnetic field of 100 Oe (in which case the graph points were determined as the sample was cooled), marked as FC on FIG. 5.

FIG. 5A illustrates the results for determination of the magnetic susceptibility ($\chi$) of the materials formed at 210° C. FIG. 5B presents $1/\chi$ and FIG. 5C presents $\chi*T$. As can be seen, the materials have a critical transition temperature of about 26 K.

The relative amounts of hydrogenation were also determined for the different samples. The materials formed at 350° C. were estimated to carry about 18 hydrogens.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for enhancing one or more superconductive characteristics of superconductive fullerenes comprising transmitting electromagnetic radiation comprising ultraviolet light, visible light, or infrared light to the superconductive fullerenes, the electromagnetic radiation impinging upon the superconductive fullerenes with an energy that is greater than the band gap of the superconductive fullerenes, wherein the superconductive fullerenes are hydrogenated and intercalated and have the general structure of:

$Cs_aRb_bK_cM_yC_nH_x$ in which M=Hg, Bi, or Tl
a, b, c=0-3,
y=0-2,
wherein at least one of a, b, y is at least 1
n is 20 or greater, and
x=about 10 or more.

2. The method of claim 1, wherein the one or more superconductive characteristics include an increase in the critical transition temperature of the superconductive fullerenes at a constant magnetic field; the existence of a superconducting hysteresis over a changing magnetic field; a decrease in the stabilizing magnetic field required for the onset of superconductivity; and/or an increase in the stability of superconductivity over a magnetic field.

3. The method of claim 2, wherein the critical transition temperature of the superconductive fullerenes when in photonic communication with the electromagnetic radiation increases by about 10 K or more.

4. The method of claim 2, wherein the critical transition temperature of the superconductive fullerenes when in photonic communication with the electromagnetic radiation increases by from about 10 K to about 25 K.

5. The method of claim 2, wherein the critical transition temperature of the superconductive fullerenes when in photonic communication with the electromagnetic radiation is 77 K or greater.

6. The method of claim 2, wherein a stabilizing magnetic field of the superconductive fullerenes when in photonic communication with the electromagnetic radiation is about 1000 Oe or less.

7. The method of claim 1, wherein the superconductive fullerenes are halogenated.

8. The method of claim 1, wherein the superconductive fullerenes are derivatized.

9. The method of claim 1, wherein the electromagnetic energy impinges on the fullerenes at an energy of about 1 electron Volt or greater.

10. The method of claim 9, wherein the electromagnetic energy impinges on the fullerenes at an energy of from about 1.3 electron Volts to about 2 electron Volts.

11. The method of claim 1, wherein x=n−2.

12. A method for enhancing one or more superconductive characteristics of superconductive fullerenes comprising transmitting electromagnetic radiation to the superconductive fullerenes, the electromagnetic radiation impinging upon the fullerenes with an energy that is greater than the band gap of the superconductive fullerenes, wherein the superconductive fullerenes are hydrogenated and intercalated and have the general structure of:

$Cs_aRb_bK_cM_yC_nH_x$ in which M=Hg, Bi, or Tl
a, b, c=0-3,
y=0-2,
wherein at least one of a, b, y is at least 1
n is 20 or greater, and
x=about 10 or more.

13. The method of claim 12, wherein the one or more superconductive characteristics include an increase in the critical transition temperature of the superconductive fullerenes at a constant magnetic field; the existence of a superconducting hysteresis over a changing magnetic field; a decrease in the stabilizing magnetic field required for the onset of superconductivity; and/or an increase in the stability of superconductivity over a magnetic field.

14. The method of claim 13, wherein the critical transition temperature of the superconductive fullerenes when in photonic communication with the electromagnetic radiation increases by about 10 K or more.

15. The method of claim 13, wherein the critical transition temperature of the superconductive fullerenes when in photonic communication with the electromagnetic radiation increases by about 10 K to about 25 K.

16. The method of claim 13, wherein the critical transition temperature of the superconductive fullerenes when in photonic communication with the electromagnetic radiation is 77 K or greater.

17. The method of claim 13, wherein a stabilizing magnetic field of the superconductive fullerenes when in photonic communication with the electromagnetic radiation is about 1000 Oe or less.

18. The method of claim 12, wherein the superconductive fullerenes are halogenated.

19. The method of claim 12, wherein the superconductive fullerenes are derivatized.

20. The method of claim 12, wherein the electromagnetic energy impinges on the fullerenes at an energy of about 1 electron Volt or greater.

21. The method of claim 12, wherein the electromagnetic energy impinges on the fullerenes at an energy of from about 1.3 electron Volts to about 2 electron Volts.

* * * * *